United States Patent [19]

Raisinghani et al.

[11] Patent Number: 5,805,005

[45] Date of Patent: Sep. 8, 1998

[54] VOLTAGE LEVEL CONVERTER WITH INDEPENDENTLY ADJUSTABLE RISE AND FALL DELAYS

[75] Inventors: Jasleen M. Raisinghani, Sunnyvale; Craig N. Lambert, San Jose, both of Calif.

[73] Assignee: Exar Corporation, Fremont, Calif.

[21] Appl. No.: 918,703

[22] Filed: Aug. 22, 1997

Related U.S. Application Data

[63] Continuation of Ser. No. 579,316, Dec. 27, 1995, abandoned.

[51] Int. Cl.⁶ ............................................. H03K 19/094
[52] U.S. Cl. ...................... 327/333; 327/112; 327/437; 326/63; 326/77
[58] Field of Search ........................ 327/108–112, 170, 327/333, 374–377, 427, 434, 437; 326/62, 63, 66, 73, 82, 83, 86, 115, 77

[56] References Cited

U.S. PATENT DOCUMENTS

| 5,332,935 | 7/1994 | Shyu ............................................. 326/73 |
| 5,528,171 | 6/1996 | Doi et al. .................................... 326/66 |

*Primary Examiner*—Kenneth B. Wells
*Attorney, Agent, or Firm*—Townsend and Townsend and Crew LLP

[57] ABSTRACT

A voltage level converter circuit is presented that is capable of independently adjusting the falling edge and rising edge delays of the output signal. The circuit includes two separate transconductance amplifiers each biased independently. Each one of the transconductance amplifiers separately drives an output transistor. The circuit is particularly suited for converting ECL signals to CMOS logic levels.

9 Claims, 10 Drawing Sheets

VOLTAGE LEVEL CONVERTER WITH INDEPENDENTLY ADJUSTABLE RISE AND FALL DELAYS

This is a Continuation of application Ser. No. 08/579,316, filed Dec. 27, 1995, now abandoned.

BACKGROUND OF THE INVENTION

This invention relates in general to voltage level converter circuits, and in particular to an ECL-to-CMOS voltage level converter with independently adjustable rise and fall delays.

An increasingly large percentage of integrated circuits (ICs) being developed today can be characterized as mixed-signal ICs that combine both analog and digital subcircuits. Also increasingly, such circuits are being developed in BiCMOS technologies that take advantage of the large transconductance and low-voltage operation of bipolar transistors in the analog functions and in emitter-coupled logic (ECL), and the low power dissipation and ease of design of CMOS in the digital logic sections.

At various points in such circuits, it becomes necessary to pass signals from the analog to the digital sections. The signal swings in the bipolar analog and ECL subcircuits can readily be made compatible, making the interface between the two types of subcircuits relatively straightforward. At points in the circuit where the bipolar circuitry must interface with the CMOS logic, however, negotiating the difference between signal swings has historically been a problem. The problems in this case are primarily due to excessive delays in the signal and asymmetrical delays in the rising and falling edges.

Virtually every ECL-to-CMOS voltage level converter uses a bipolar or CMOS transconductance ($g_m$) amplifier or voltage comparator driving an inverter. An example of the latter type is shown in FIG. 1. A PNP differential pair (Q11 and Q12) directs the tail current Ie into one of the two resistors R1 or R2 with exemplary values of 5 kΩ. Assuming that the voltage at the base of transistor Q11 is higher than that at the base of transistor Q12 by more than 26 mV, almost all of the tail current Ie flows into R2. The resulting voltage drop turns transistor Q9 on. At the same time, the voltage across R1 drops to zero, turning transistor Q10 off. Transistor Q9 becomes capable of sinking a relatively large amount of current, while at the same time PMOS transistor M8 turns off. The collector of transistor Q9, therefore, goes to a low voltage, driving the voltage at the output node 11 to the positive rail. A similar analysis shows that the collector of transistor Q10 goes to a high voltage, driving the output at node 10 to ground.

The delay associated with the rising and falling edges of the outputs of this converter is determined primarily by the rate at which the NPN transistors in the gain stage (i.e., Q9 and Q10) can turn on and off. To maintain speed, diode-connected transistors Q5, Q6, Q7, and Q8 are included to prevent saturation of the gain NPNs. To turn the transistors on, the input stage current must flow through the resistors and charge the capacitances associated with the base terminals of the transistors. This delay can be varied by increasing or decreasing the tail current. Turning the transistors off, however, is independent of the current and is set by the RC time constant of the resistors and the parasitic capacitances at the base terminals. If the resistors are kept fairly small, the switching delay through this converter is determined by the tail current Ie.

It is to be understood that the ECL voltage levels referred to herein are not the industry-standard ECL levels, which require a negative power supply. Rather, the convention used here refers the ECL voltage levels to the positive power supply. That is, the positive ECL output level is one diode voltage below the positive supply and the negative ECL output level is several hundred millivolts below that.

FIG. 2 shows the output of a transient analysis of the circuit of FIG. 1, with a tail current Ie of, for example, 150 µA. There is shown approximately 6 to 7 nsec of delay between the time the input curves 200 transition to the time the output 202 responds. FIG. 3 is also an output of a transient analysis of the circuit, this time with 500 µA of tail current. As expected, the increased current has decreased the delay down to about 2 nsec. To reach the sub-nanosecond delays required in modern ICs, however, would take many milliamps of tail current. Another shortcoming of the circuit of FIG. 1 is that it requires a supply voltage of over 3V to switch quickly. This disqualifies it from use in a growing segment of mixed-signal integrated circuits.

An example of the transconductance ($g_m$-input) type ECL-to-CMOS converter is shown in FIG. 4. In this circuit, the PNP differential pair (Q403, Q404) switches the tail current into one NMOS mirror transistor M405 or the other M408. If the tail current is directed into transistor M408, transistor M407 tries to pull an equal amount of current out of node 5. At the same time, the current in M406 drops to zero, and M411 stops sourcing current. Transistor M407 pulls the gate terminals of M412 and M413 low, and the output node 6 swings high. Examples of the operation of this type of circuit are shown in FIGS. 5 and 6, for tail currents of 150 and 500 µA, respectively. At higher currents, the delay to the rising edge is reduced significantly, while the delay to the falling edge is reduced slightly. This type of converter, too, falls short of the short (sub-nanoseconds) delay requirement.

Another type of $g_m$-input ECL-to-CMOS converter is shown in FIGS. 7A and 7B. The $g_m$ amplifier may be preceded by a fast comparator or other gain stage to increase the signal, but the actual ECL-to-CMOS conversion typically uses a circuit similar to those shown in FIGS. 7A and 7B. In FIG. 7A, the PMOS differential pair (M705, M708) converts an ECL input signal voltage to a current which is applied to the NMOS active load transistors M701 and M702. The difference between the currents in the differential pair transistors is the output current from the $g_m$ stage. This current charges the capacitances associated with the gate terminals of the inverter transistors (M712, M713) to swing the input of the inverter high or low. The output of the inverter responds with a full CMOS swing. The circuit of FIG. 7B operates in the same manner, with the terms "NMOS" and "PMOS" transposed.

In operation, when the non-inverting input is more positive than the inverting input, the output current from the $g_m$ amplifier is negative, attempting to pull current out of the gate terminals of the MOS transistors comprising the inverter. Because the gate terminal of an MOS transistor is very nearly an infinite impedance, the current actually comes from the parasitic capacitances shown in phantom in FIGS. 7A and 7B. In this example, the gate-to-source capacitance of the PMOS pull-up transistor is charged in such a way that the absolute magnitude of the gate-to-source voltage is large, turning the transistor on. At the same time, charge has been drawn off of the gate-to-source capacitance of the NMOS pull-down transistor, reducing the voltage and turning the transistor off. In this condition, the voltage at the drain terminals of the inverter transistors (the output of the converter) is high.

If the inverting input is brought high with respect to the non-inverting input, current is sourced from the $g_m$ amplifier, the PMOS gate-to-source capacitance $C_{gs}$ is discharged, the NMOS $C_{gs}$ is charged, and the inverter output swings low.

A problem with this type of stage is that the amounts by which the rising edge and the falling edge are delayed with respect to the crossing of the input signals are not equal. In the circuit of FIG. 7A, the falling edge is delayed considerably more than the rising edge, while in the circuit of FIG. 7B, the opposite is true. This occurs because the signal at the input to the inverter stage does not swing rail-to-rail, as shown in FIG. 8A. FIG. 8A shows the transient response of the circuit of FIGS. 7A and 7B at the input to the inverters with an input stage current (tail current) of 150 μA. The NMOS active load transistors M701 and M702 in FIG. 7A swing from ground to a voltage several hundred millivolts below the positive supply rail. The PMOS active load transistors M716 and M717 in FIG. 7B ranges from the positive rail to a few hundred millivolts above ground. The time required to switch the inverter, therefore, is not just a function of the slew rate of the inverter's input node (the current out of the $g_m$ amplifier divided by the magnitude of the parasitic capacitance), but also of the difference between the inverter's switching voltage and the voltage at which the node is sitting before the signal is applied. Ignoring second-order effects for now, the ratio of the delays is given by:

$$\left| \frac{\Delta_-}{\Delta_+} \right| = \left| \frac{\frac{g_m V_{in+}}{C} (V_H - V_S)}{\frac{g_m V_{in+}}{C} (V_S - V_L)} \right|$$

in which $\Delta_+$ is the delay associated with the rising edge,
$\Delta_-$ is the delay associated with the falling edge,
$g_m V_{in+}/C$ is the positive slew rate of the inverter's input,
$g_m V_{in-}/C$ is the negative slew rate of the inverter's input,
$V_S$ is the voltage at the input to the inverter at which the output of the inverter switches,
$V_H$ is the maximum voltage to which the inverter input is driven by the $g_m$ stage, and
$V_L$ is the minimum voltage to which the inverter input is driven by the $g_m$ stage.

$V_S$ is typically about midway between the positive power supply and ground, so the observation that the voltage swing at the input of the inverter is not symmetric around the midpoint of the supply supports the argument that this type of converter stage will have dissimilar delays to the positive and negative edges. Increasing the tail current to the differential pair will raise the slew rate and reduce the delays, but will not correct the delay asymmetry.

FIG. 8B shows the outputs of the converters of FIGS. 7A and 7B with tail currents of 150 μA, demonstrating the delay asymmetry explained in the foregoing discussion. FIG. 9A and 9B show the output of transient analyses of FIGS. 7B and 7B again (inverter input drive and converter output), but with a tail current equal to 500 μA. As stated above, the increased tail current reduces the delays, but does not help the asymmetry.

There is therefore a need for an ECL-to-CMOS voltage level converter that minimizes, as well as adjusts the asymmetry in, the delays associated with the rise and fall of the converter output signal.

SUMMARY OF THE INVENTION

The present invention provides a voltage level converting circuit technique that addresses the problem of asymmetrical delay in the rising and falling edge of the converter output. The circuit has the added advantage that the positive and the negative delays can be adjusted by the designer independently. The independent tuning of the rise and fall delay times provides the designer with an added degree of freedom to, for example, compensate for delays in other parts of the system. The technique of the present invention is particularly suited for ECL-to-CMOS voltage level converter circuits.

Broadly, the circuit of the present invention includes two separate transconductance amplifiers with opposite polarities. Each transconductance amplifier separately drives an output transistor. The output inverter of the prior art is thus replaced by separately driven pull-up and pull-down transistors. By proper ratioing of the transistor sizes any mismatch in the delays can be minimized. Independent adjusting of the falling edge and rising edge delays can be achieved by controlling the amount of the tail current in each transconductance amplifier.

Accordingly, in one embodiment, the present invention provides a voltage level converting circuit having an input terminal and an output terminal. The circuit includes a first transconductance amplifier of a first polarity having an input coupled to the circuit input terminal, and a second transconductance amplifier of a second polarity having an input coupled to the circuit input terminal, a pull-up output transistor having a control terminal coupled to an output of the first transconductance amplifier, and a pull-down output transistor having a control terminal coupled to an output of the second transconductance amplifier. The output terminals of the pull-up and pull-down transistors couple to the output terminal of the voltage level converting circuit.

A better understanding of the nature and advantages of the voltage level converter circuit of the present invention may had by referring to the detailed description and the drawings below.

DESCRIPTION OF THE PREFERRED EMBODIMENT

Figure 10:
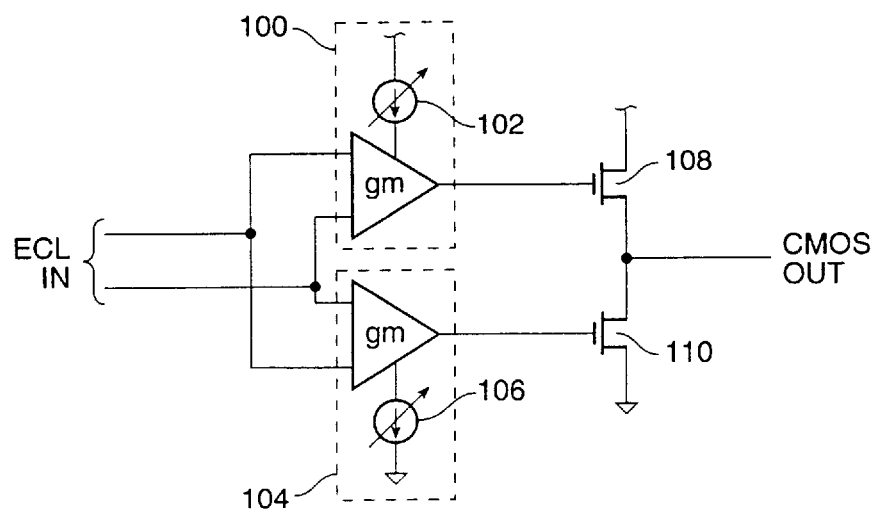
FIG. 10 shows a block diagram of the voltage level converter of the present invention.

A block diagram of the voltage level converter of the present invention is shown in FIG. 10. A first transconductance amplifier 100 receives the ECL signal at its differential inputs. Amplifier 100 is a transconductance stage with a current source 102. A second transconductance amplifier 104 also receives the ECL signal at its differential inputs. Amplifier 104 is a transconductance stage with a current source 106. The output of the transconductance amplifier 100 drives the gate terminal of a pull-up MOS transistor 108, while the output of the transconductance amplifier 104 drives the gate terminal of a pull-down MOS transistor 110. The drain terminals of the output MOS transistors 108 and 110 connect to the output of the converter circuit and carry the output signal which is a CMOS level equivalent of the ECL input signal. Thus, the output inverter has been replaced by two independently driven transistors.

The circuit of FIG. 10 allows for independent adjustment of the falling edge and rising edge delays. This is achieved by tuning the bias current levels in each transconductance amplifier. The speed of the transconductance amplifier 100 is adjusted by the amount of current in the current source 102, while the speed of the transconductance amplifier 104 is adjusted by the amount of current in the current source 106. Thus, an asymmetry in signal delay can be compensated for (or designed for) by adjusting the bias current levels of the two transconductance amplifiers 100 and 104. The operation of the circuit will be described in more detail hereinafter in connection with the exemplary circuit implementation shown in FIG. 11.

Figure 11:
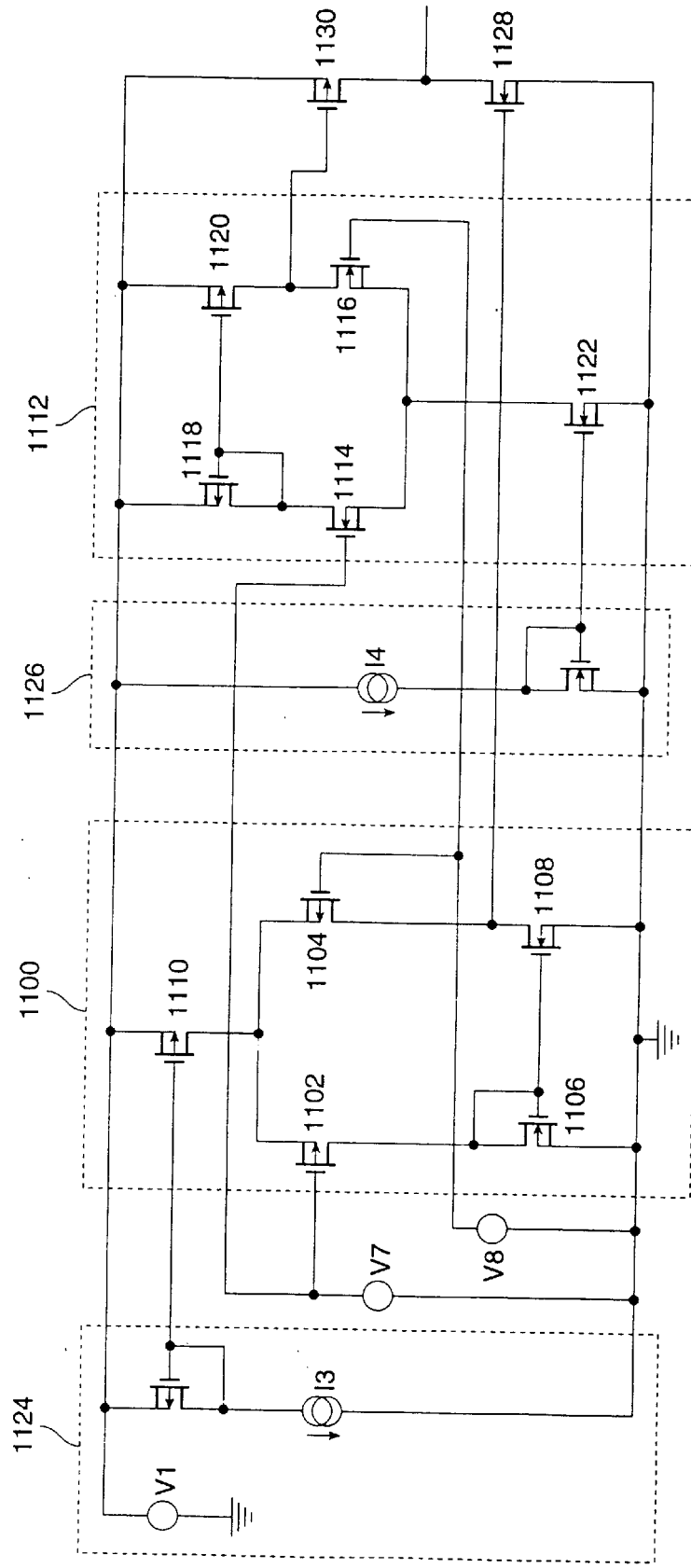
FIG. 11 is an exemplary circuit schematic of an ECL-to-CMOS voltage level converter according to the present invention.

FIG. 11 shows a first transconductance amplifier 1100 having PMOS input transistors 1102 and 1104, NMOS load transistors 1106 and 1108, and PMOS current source transistor 1110. A second transconductance amplifier 1112 is made up of transistors that are complementary to that of the first transconductance amplifier 1100. The second amplifier 1112 includes NMOS input transistors 1114 and 1116, PMOS load transistors 1118 and 1120, and NMOS current source transistor 1122. Current source transistors 1110 and 1122 are separately driven by current mirror bias networks 1124 and 1126, respectively. The gate terminals of the input differential pair in each amplifier connect to the ECL input signals. The output terminal of the first transconductance amplifier 1100 drives the gate terminal of an NMOS pull-down transistor 1128, and the output terminal of the second transconductance amplifier 1112 drives the gate terminal of a PMOS pull-up transistor 1130. The drain terminals of the NMOS pull-down transistor 1128 and the PMOS pull-up transistor 1130 connect to the output of the circuit and provide CMOS voltage levels.

Figure 1:
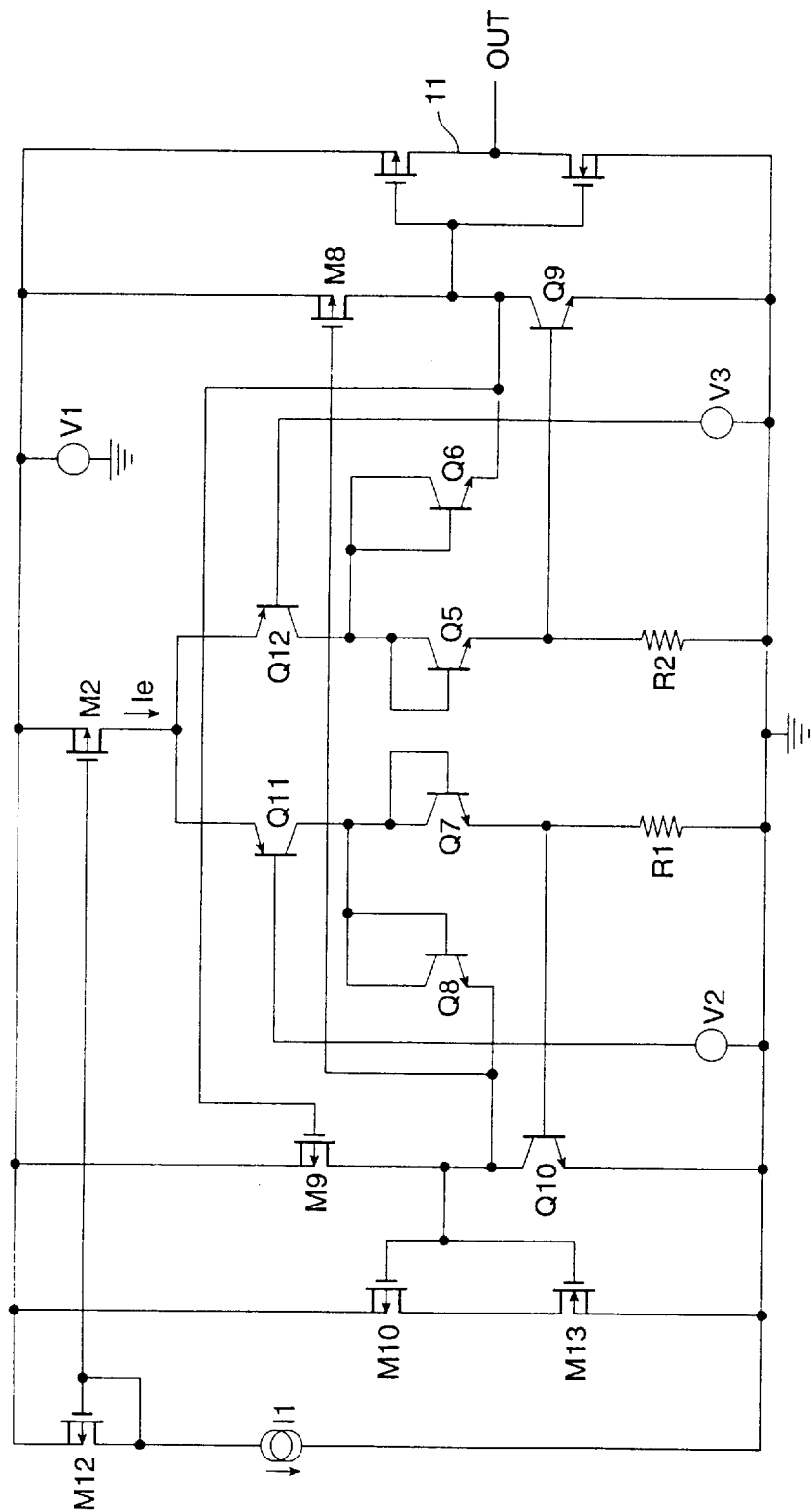
FIG. 1 is a circuit schematic of a prior art ECL-to-CMOS voltage level converter using a comparator followed by an inverter.
Figure 2:
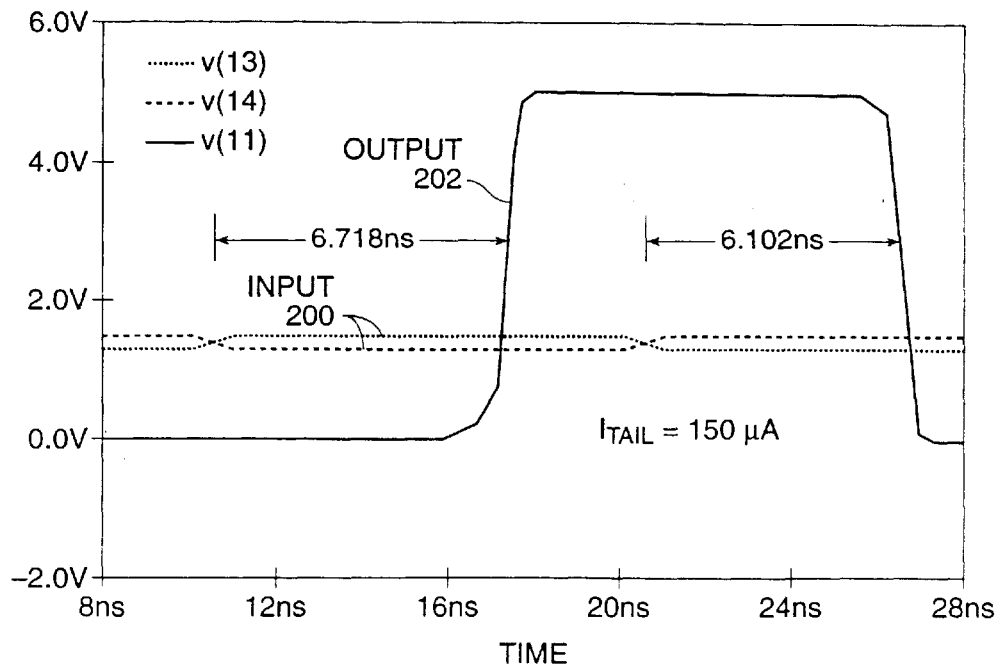
FIGS. 2 and 3 illustrate the transient response of the circuit of FIG. 1 at two different bias current levels, respectively.
Figure 3:
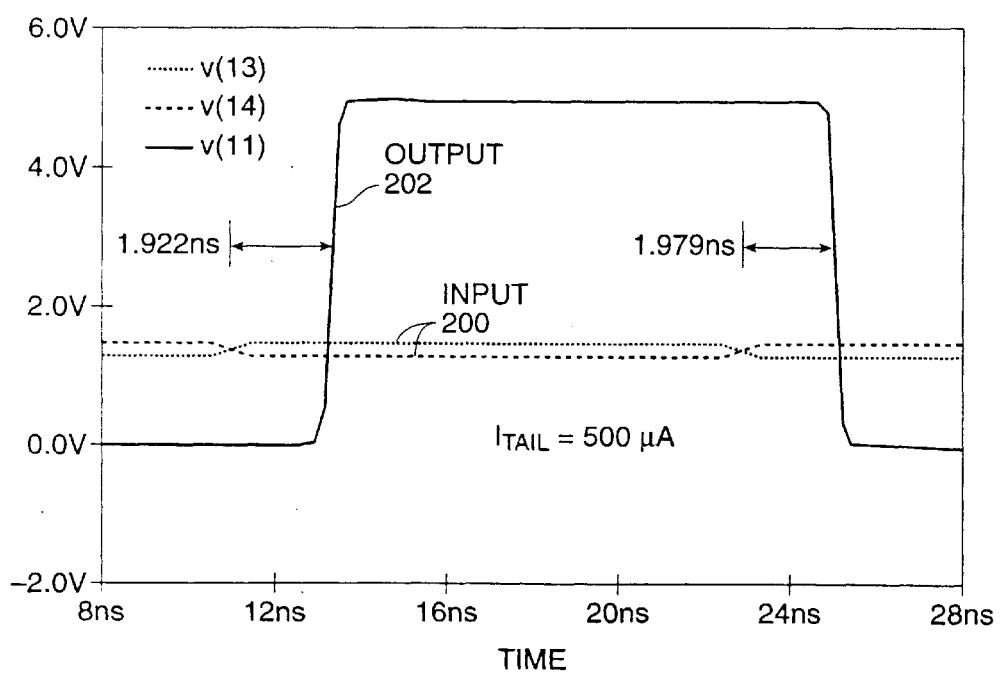
Figure 4:
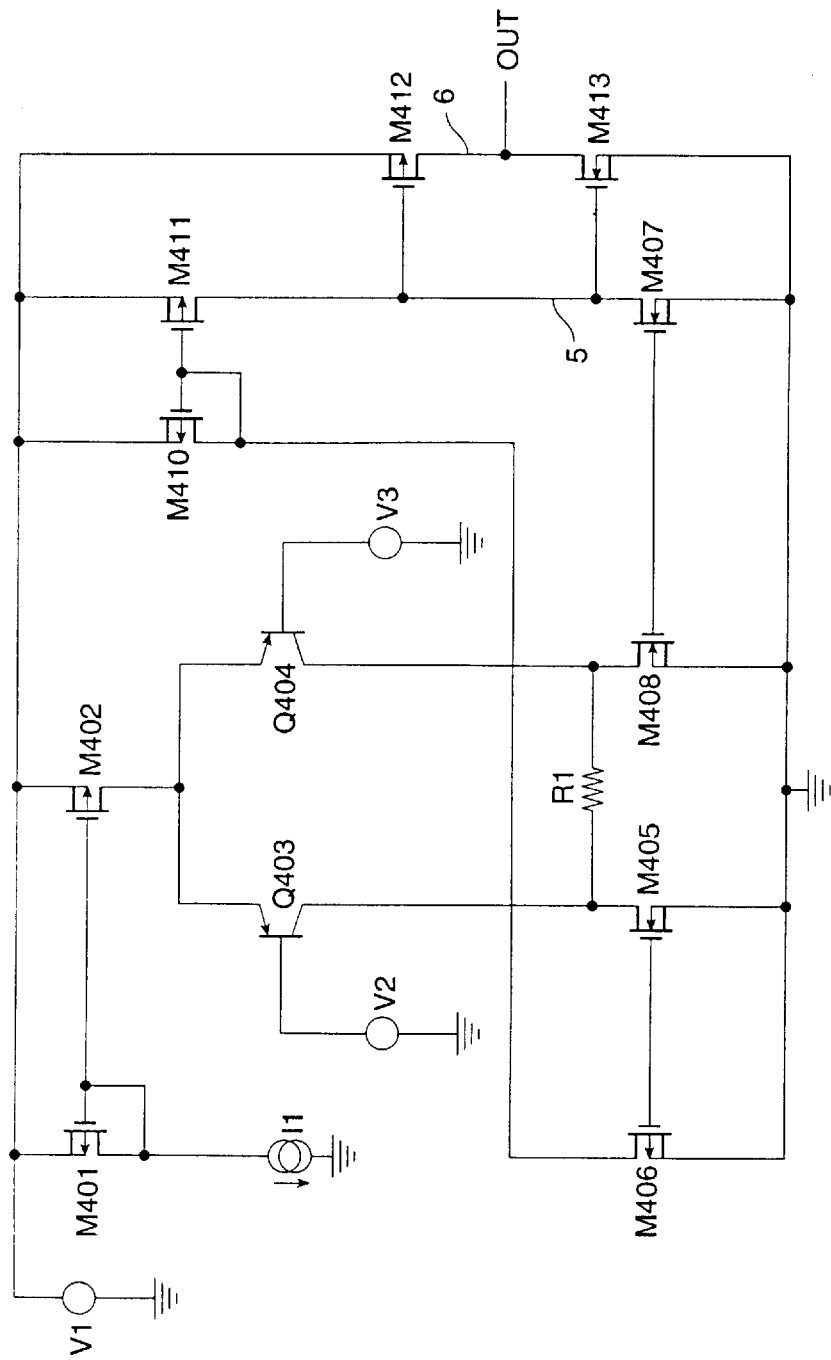
FIG. 4 is a circuit schematic of a prior art ECL-to-CMOS voltage converter using a transconductance amplifier followed by an inverter.
Figure 5:
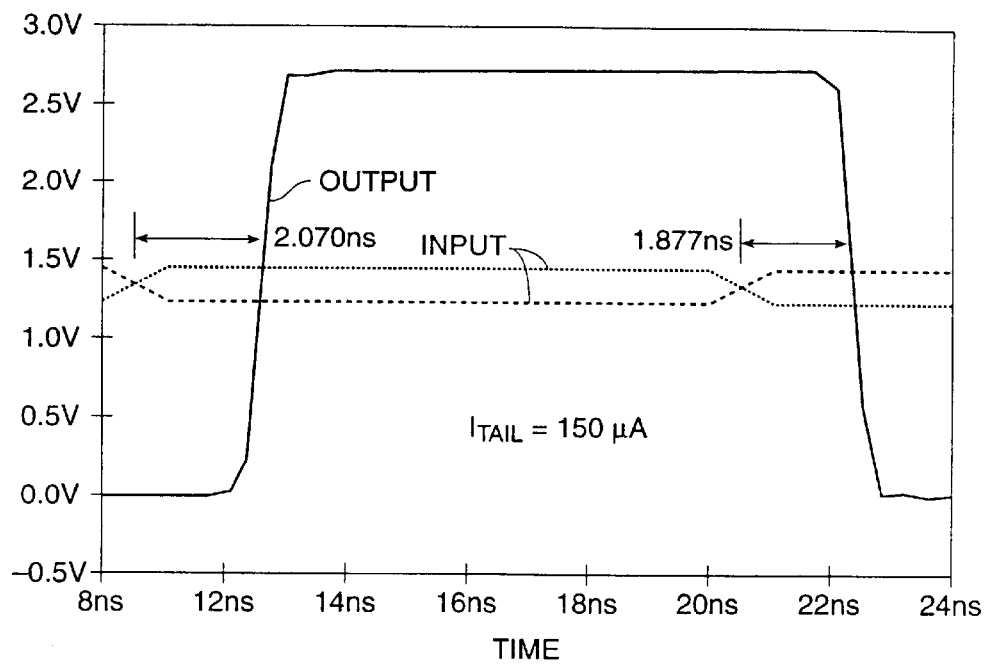
FIGS. 5 and 6 illustrate the transient response of the circuit of FIG. 4 at two different bias current levels, respectively.
Figure 6:
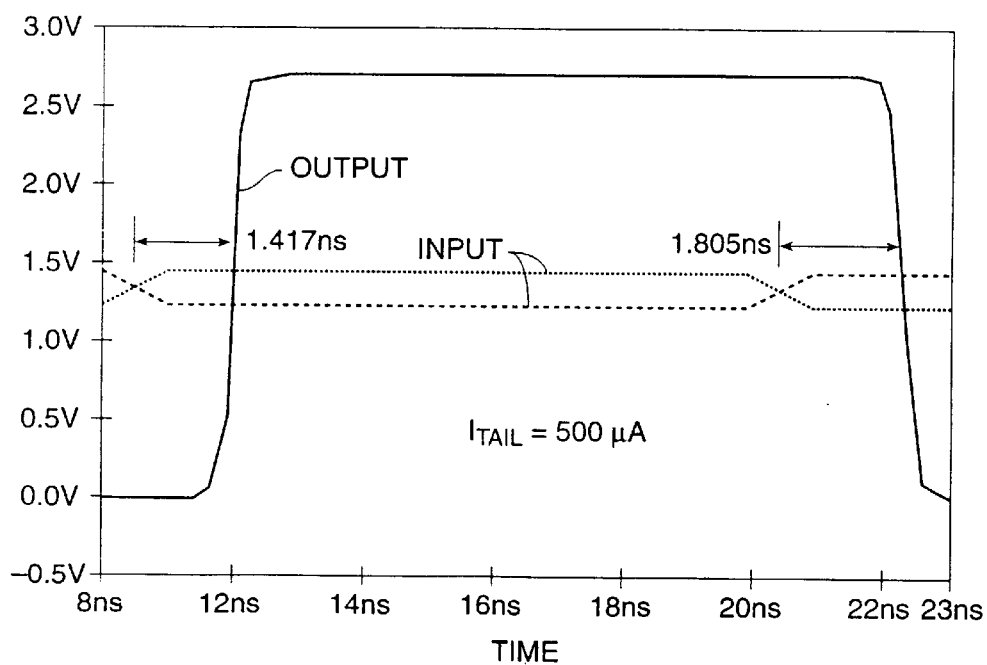
Figure 7A:
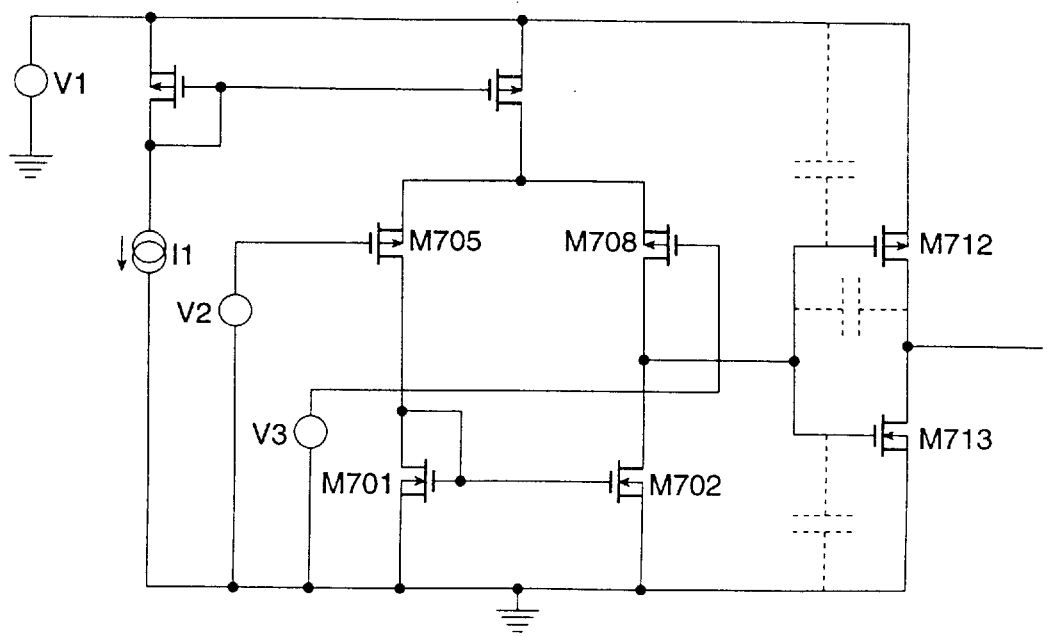
FIG. 7A and 7B show circuit schematics for two embodiments based on another type of transconductance-type ECL-to-CMOS voltage level converter.
Figure 7B:
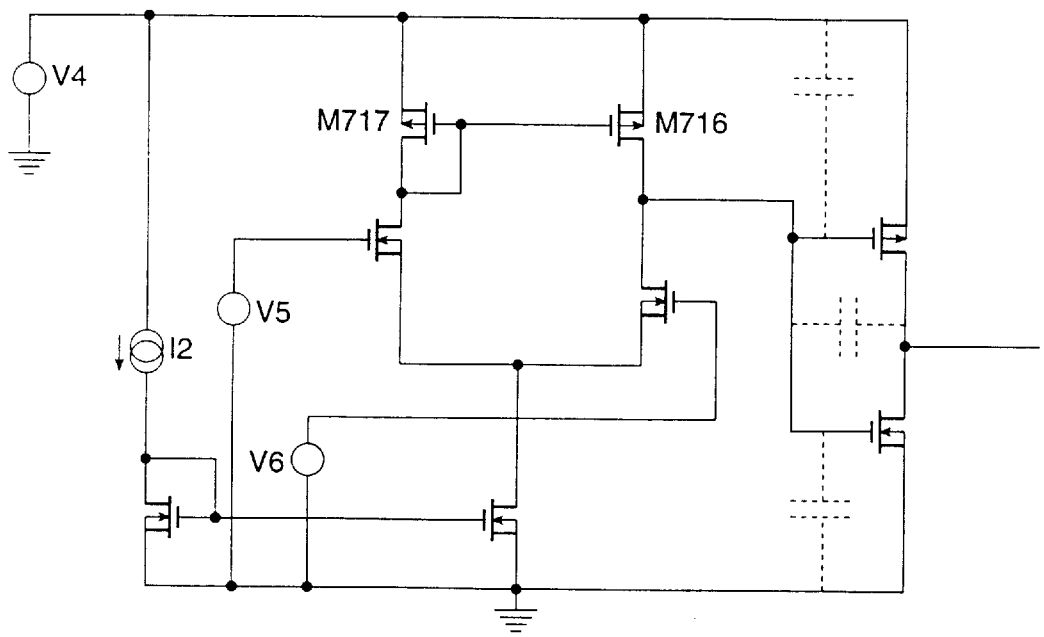
Figure 8A:
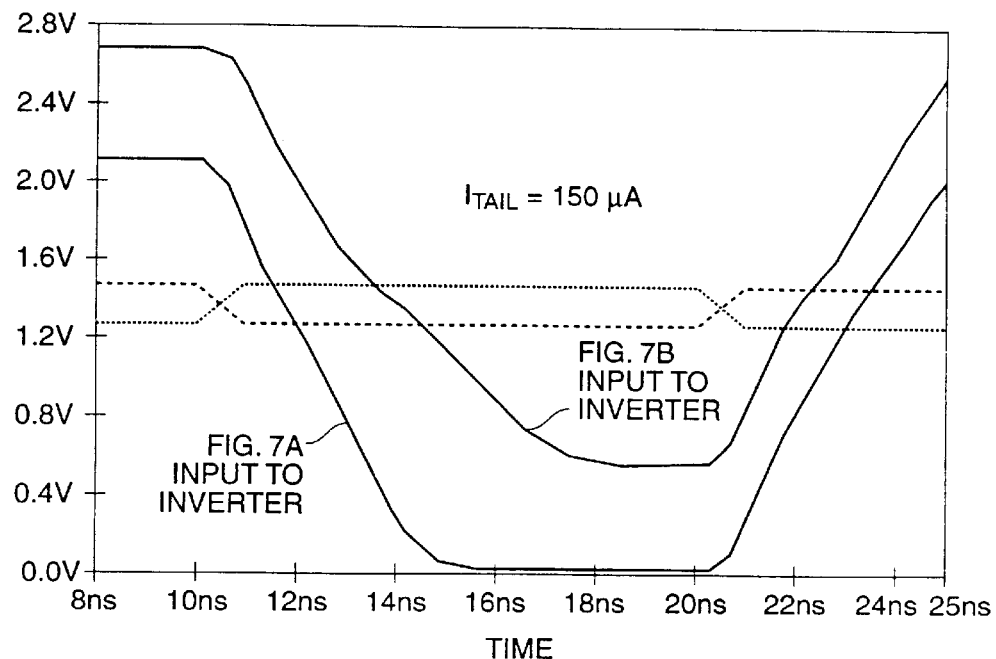
FIGS. 8A and 8B illustrate the transient response of the circuits of FIGS. 7A and 7B at a given bias current level, at the input of the inverter stage and the output of the circuit, respectively.
Figure 8B:
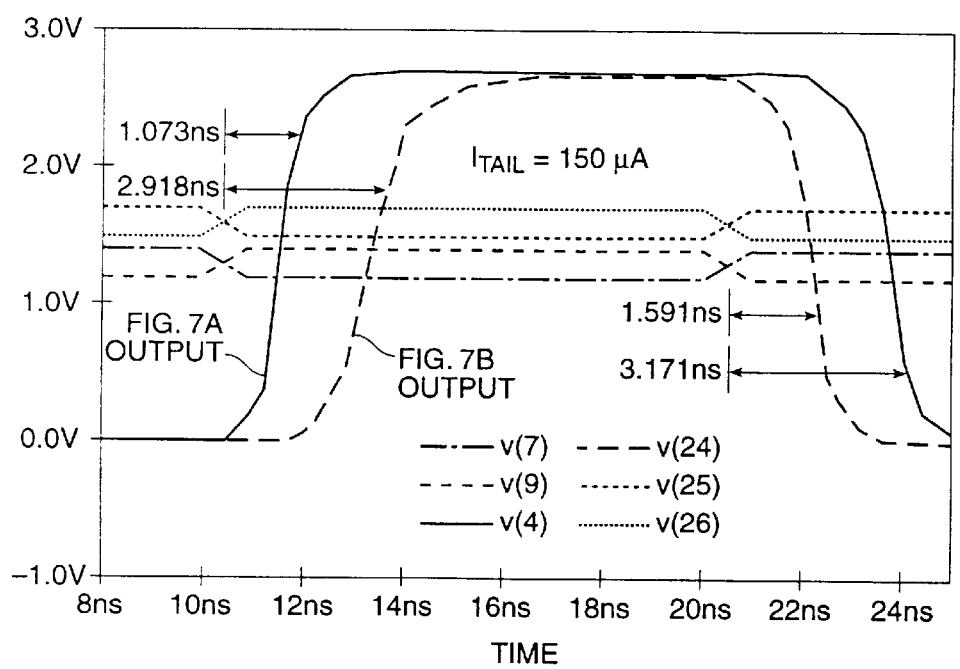
Figure 9A:
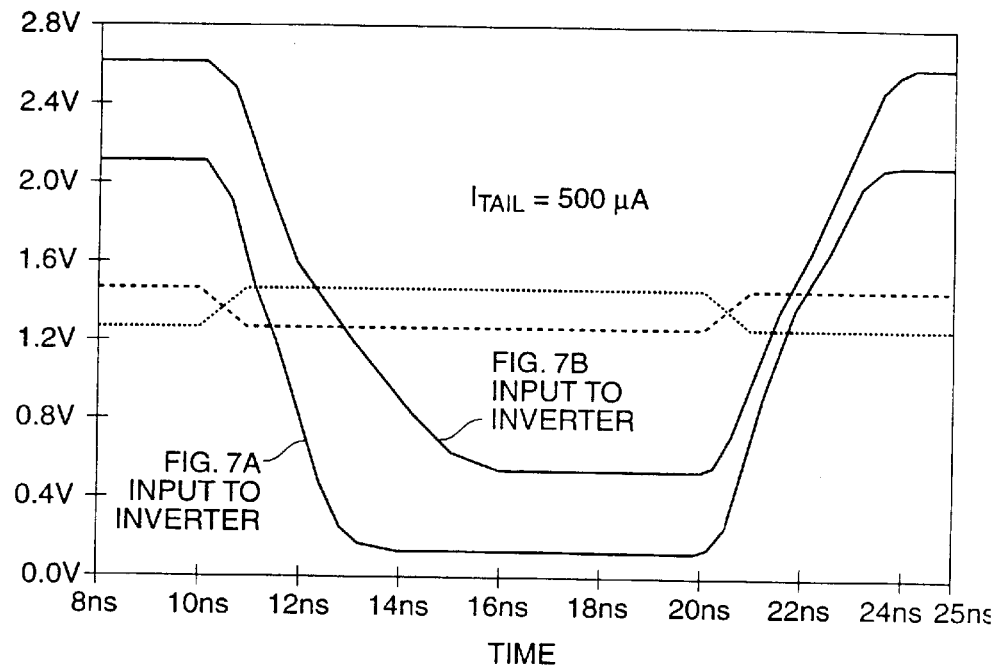
FIGS. 9A and 9B illustrate the transient response of the circuits of FIGS. 7A and 7B at a higher bias current level, at the input of the inverter stage and the output of the circuit, respectively.
Figure 9B:
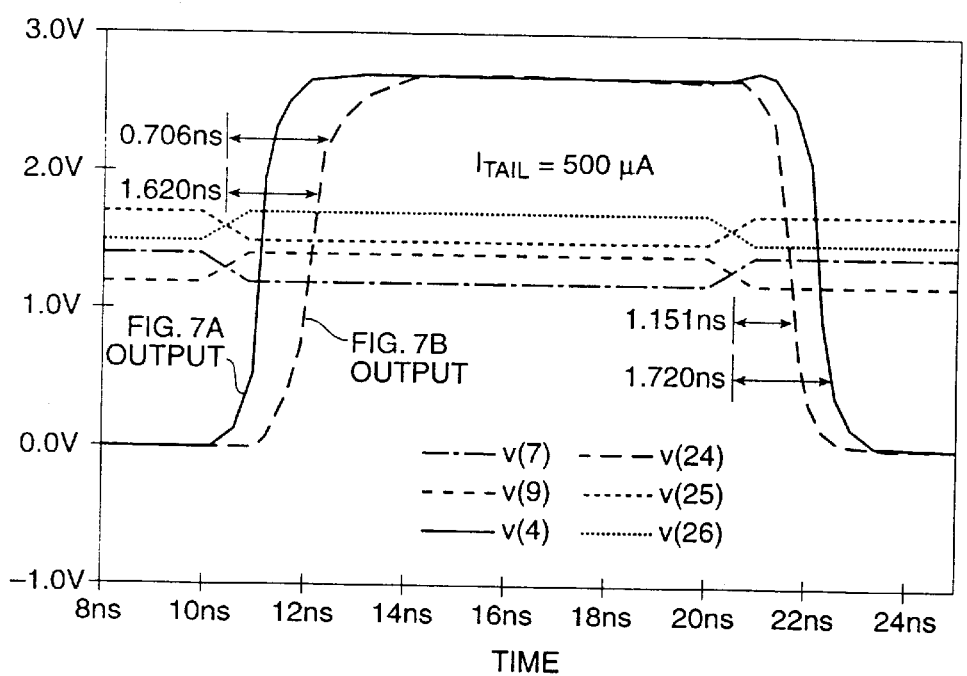
Figure 12A:
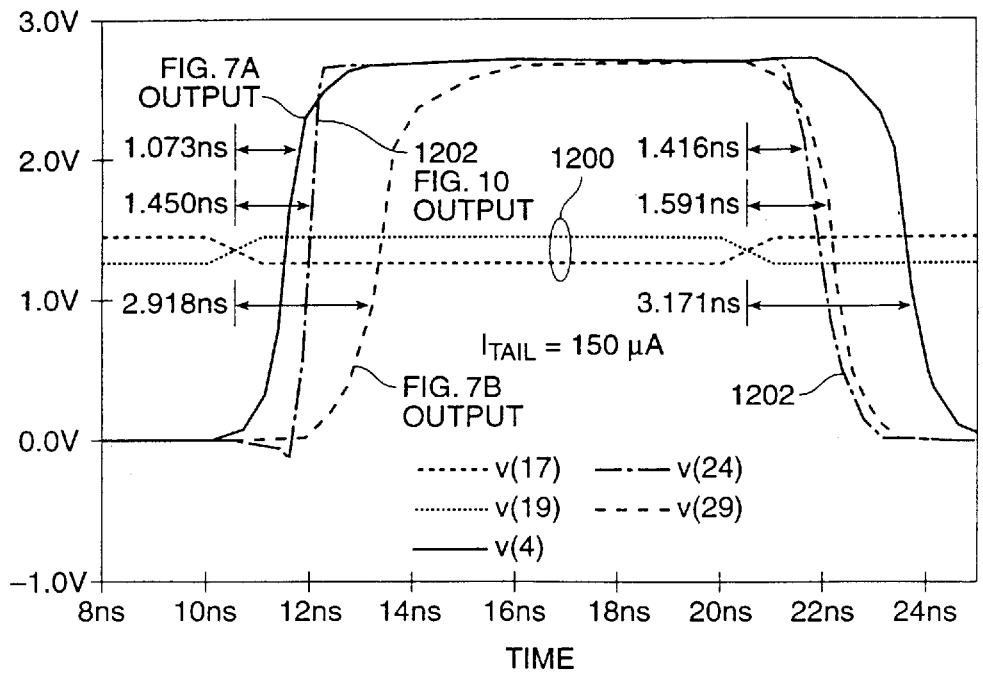
FIGS. 12A and 12B illustrate the transient response of the circuit of FIG. 11 at two different bias current levels adjusted for symmetrical operation.
Figure 12B:
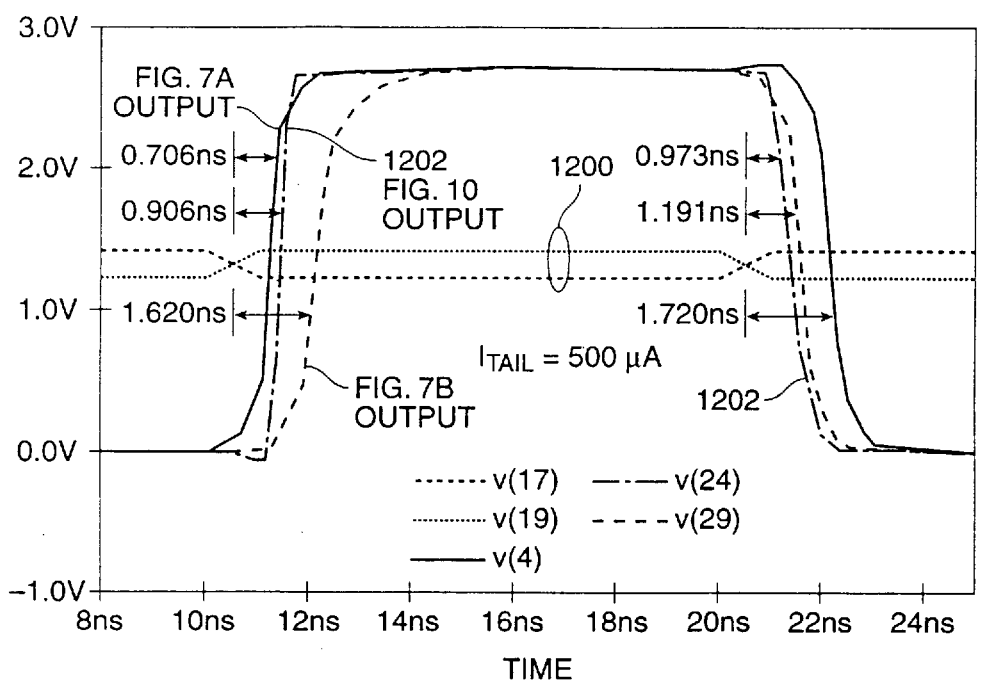

The transient characteristics of the circuit of FIG. 11 are shown in FIGS. 12A and 12B for tail currents of 150 $\mu$A and 500 $\mu$A, respectively. The transient responses of the circuits of FIGS. 7A and 7B are also shown for comparison purposes. The transconductance amplifiers 1100 and 1112 are designed with matched current sources (i.e., identical bias currents through the current source transistors 1110, and 1122), and with the PMOS transistors three times as large as the NMOS transistors to compensate for the transconductance ($g_m$) differential. Lines 1200 show the ECL differential input signal, with line 1202 illustrating the response at the output of the circuit of FIG. 11. As shown by the diagram, the difference in the falling edge and rising edge delays is measured at about a few picoseconds (about 7% mismatch at 500 $\mu$A and 2% at 150 $\mu$A). The symmetry in the delays is obtained because the magnitude of the drive signal to the output PMOS transistor 1130 is the same as the drive signal to the output NMOS transistor 1128. That is, when the PMOS transistor 1130 is turned off, its gate is driven all the way up to the power supply, and when the output NMOS transistor 1128 is turned off, its gate is driven all the way to ground.

Figure 13:
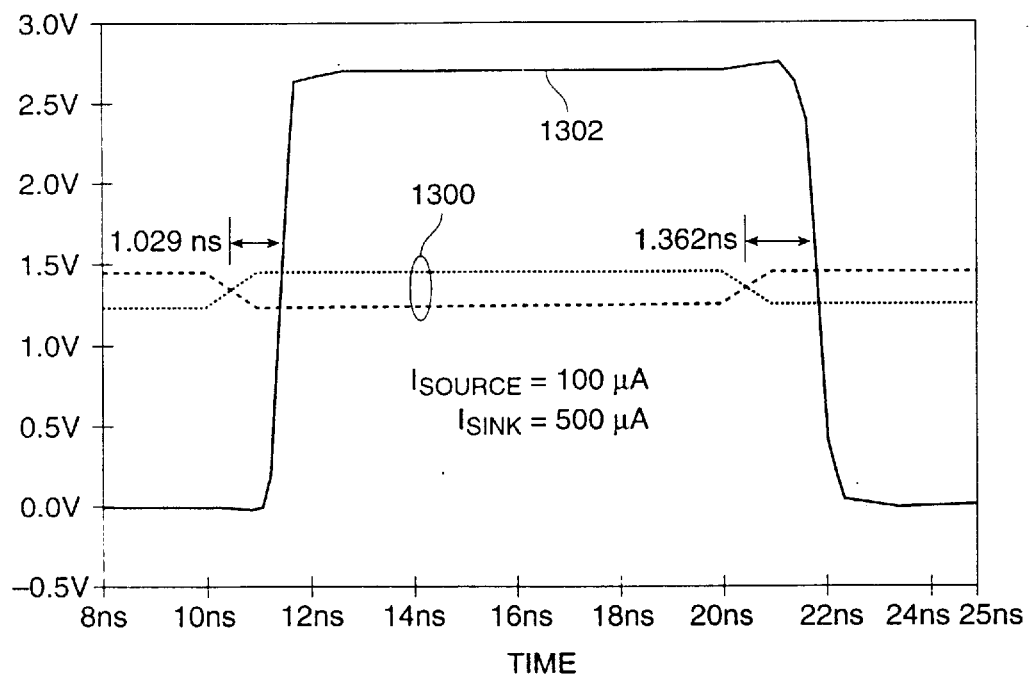
FIG. 13 illustrates the transient response of the circuit of FIG. 11 with the bias current levels adjusted to achieve well-controlled but asymmetrical delay.

The circuit of FIG. 11 also allows the output signal rising edge and falling edge delays to be intentionally mismatched. This is achieved by changing the ratio of the tail currents (through current source transistors 1110 and 1122) to create a difference between the positive and negative slew rates. As an example, FIG. 13 demonstrates the effect with a 100 $\mu$A current source through PMOS transistor 1110, and a 500 $\mu$A current sink through NMOS transistor 1122. The differential input signal is shown by lines 1300 and the output signal by line 1302. The delay of the falling edge of the output signal 1302 is now more than 30% longer than the delay of the rising edge. A shift in the opposite direction is also possible with the appropriate choice of tail currents.

In conclusion, the present invention provides a voltage level converting circuit that allows for independent control of the rising edge and falling edge delays of the output signal. The circuit achieves the independent control by providing two separate transconductance amplifiers that are independently biased. Each amplifier then separately drives an output device. The output signal falling edge and rising edge are adjusted by setting the bias currents through the transconductance amplifiers. While the above is a complete description of a specific embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A voltage level converting circuit having first and second input terminals and an output terminal, the circuit comprising:

a first transconductance amplifier of a first polarity having first and second input terminals respectively coupled to the first and second input terminals of the voltage level converting circuit;

a first bias circuit coupled to said first transconductance amplifier for adjusting a first tail current of said first transconductance amplifier;

a second transconductance amplifier of a second polarity having first and second input terminals respectively coupled to the first and second input terminals of the voltage level converting circuit;

a second bias circuit coupled to said second transconductance amplifier for adjusting a second tail current of said second transconductance amplifier;

a pull-up output transistor having a control terminal coupled to an output of said second transconductance amplifier, and an output terminal coupled to the output terminal of the voltage level converting circuit; and a pull-down output transistor having a control terminal coupled to an output of said first transconductance amplifier, and an output terminal coupled to the output terminal of the voltage level converting circuit, wherein, in response to an input signal applied to the first and second input terminals of said first transconductance amplifier, said first transconductance amplifier, drawing said first tail current, actively operates to control a fall-time of an output signal at the output terminal of the voltage level converting circuit, and wherein, in response to said input signal applied to the first and second input terminals of said second transconductance amplifier, said second transconductance amplifier drawing said second tail current, actively operates to control a rise-time of said output signal.

2. The voltage level converting circuit of claim 1 wherein said first transconductance amplifier comprises:

a pair of PMOS input transistors each having a gate terminal respectively coupled to the first and second input terminals of the voltage level converting circuit;

a pair of NMOS load transistors coupled to said pair of PMOS input transistors; and a PMOS current source transistor coupled to a common source terminal of said pair of PMOS input transistors.

3. The voltage level converting circuit of claim 2 wherein said second transconductance amplifier comprises:

a pair of NMOS input transistors each having a gate terminal respectively coupled to the first and second input terminals of the voltage level converting circuit;

a pair of PMOS load transistors coupled to said pair of PMOS input transistors; and an NMOS current source transistor coupled to a common source terminal of said pair of PMOS input transistors.

4. The voltage level converting circuit of claim 3 wherein said pull-up and pull-down output transistors are of PMOS and NMOS types, respectively.

5. The voltage level converting circuit of claim 4 wherein the circuit receives emitter coupled logic (ECL) signals at the first and second input terminals and generates a signal at the output terminal having complementary metal-oxide-semiconductor (CMOS) logic levels.

6. A voltage level converting circuit for converting an input signal having emitter coupled logic (ECL) signal levels at its first and second input terminals to an output signal having complementary metal-oxide-semiconductor (CMOS) logic signal levels at its output terminal, comprising:

a first transconductance amplifier comprising:
a pair of PMOS input transistors having gate terminals respectively coupled to the first and second input terminals of the voltage level converting circuit for receipt of the input signal;
a pair of NMOS load transistors coupled to said pair of PMOS input transistors; and
a PMOS current source transistor coupled to a common source terminal of said pair of PMOS input transistors;

a second transconductance amplifier comprising:
a pair of NMOS input transistors having gate terminals respectively coupled to the first and second input terminals of the voltage level converting circuit for receipt of the input signal;
a pair of PMOS load transistors coupled to said pair of NMOS input transistors; and
an NMOS current source transistor coupled to a common source terminal of said pair of NMOS input transistors;

a first bias circuit coupled to said PMOS current source transistor for adjusting a speed of said first transconductance amplifier;

a second bias circuit coupled to said NMOS current source transistor for adjusting a speed of said second transconductance amplifier;

a PMOS output transistor having a gate terminal coupled to an output terminal of said second transconductance amplifier, and an output terminal coupled to the output terminal of the voltage level converting circuit; and an NMOS output transistor having a gate terminal coupled to an output terminal of said first transconductance amplifier, and an output terminal coupled to the output terminal of the voltage level converting circuit, wherein, in response to the input signal, said first transconductance amplifier, with said PMOS current source transistor drawing current, actively operates to control a fall-time of the output signal, and wherein, in response to the input signal, said second transconductance amplifier, with said NMOS current source transistor drawing current, actively operates to control a rise-time of the output signal.

7. A method for converting a first signal defined by a first voltage level to a second signal defined by a second voltage level comprising the steps of:

(a) applying the first signal to a first transconductance amplifier of a first polarity;

(b) applying the first signal to a second transconductance amplifier of a second polarity;

(c) driving a pull-down transistor by said first transconductance amplifier to generate a falling edge of the second signal;

(d) driving a pull-up transistor by said second transconductance amplifier to generate a rising edge of the second signal; and (e) adjusting a fall-time of the second signal by a first bias circuit that controls a drive capability of said first transconductance amplifier, and (f) adjusting a rise-time of the second signal by a second bias circuit that controls a drive capability of said second transconductance amplifier, independently of said step of adjusting the fall-time of the second signal.

8. The method of claim 7 wherein said first signal is an emitter coupled logic (ECL) signal and said second signal is a complementary metal-oxide-semiconductor (CMOS) logic signal.

9. The method of claim 8 wherein said first transconductance amplifier comprises PMOS differential input transistors, and said second transconductance amplifier comprises NMOS differential input transistors, and wherein said pull-down transistor is an NMOS transistor and said pull-up transistor is a PMOS transistor.

* * * * *